（12) United States Patent
Aleksandravicius et al.

(10) Patent No.: US 6,489,881 B1
(45) Date of Patent: Dec. 3, 2002

(54) HIGH CURRENT SENSE RESISTOR AND PROCESS FOR ITS MANUFACTURE

(75) Inventors: Jonas Aleksandravicius, Vilnius (LT); Gene Pranauskiene, Vilnius (LT); Algirdas Kaskonas, Vilnius (LT); Aldo Torti, Borgaro (IT)

(73) Assignee: International Rectifier Corporation, El Segundo, CA (US)

( * ) Notice: Subject to any disclaimer, the term of this patent is extended or adjusted under 35 U.S.C. 154(b) by 11 days.

(21) Appl. No.: 09/698,880

(22) Filed: Oct. 27, 2000

Related U.S. Application Data (60) Provisional application No. 60/162,054, filed on Oct. 28, 1999.

(51) Int. Cl.[7] .............................................. H01C 1/012
(52) U.S. Cl. ..................... 338/307; 338/309; 338/324; 338/325
(58) Field of Search ................................ 338/307, 308, 338/309, 324, 325

(56) References Cited

U.S. PATENT DOCUMENTS

| | | | | |
|---|---|---|---|---|
| 3,930,304 A | * | 1/1976 | Keller et al. ................. | 338/307 |
| 4,298,856 A | * | 11/1981 | Schuchardt .................. | 338/195 |
| 4,418,856 A | * | 12/1983 | George ........................ | 338/307 |
| 4,531,111 A | * | 7/1985 | Schmidt et al. ............. | 338/195 |
| 4,777,471 A | * | 10/1988 | Comer ........................ | 338/307 |
| 5,081,439 A | * | 1/1992 | Natzle et al. ................ | 338/195 |
| 5,428,339 A | * | 6/1995 | Das ............................ | 338/195 |
| 6,091,318 A | * | 7/2000 | Lee et al. .................... | 338/309 |

* cited by examiner

Primary Examiner—Karl D. Easthom
(74) Attorney, Agent, or Firm—Ostrolenk, Faber, Gerb & Soffen, LLP (57) ABSTRACT

A low resistance high current sense resistor is formed on a semiconductor die using conventional semiconductor processing techniques. The resistor die has one or two resistive layers which are photolithographically divided into a plurality of series and parallel resistor sections connected to first and second main terminals. First and second sense terminals are connected across one or a pattern of plural ones of the resistors to produce an output related to the current between the main terminals. Fusible links permit the trimming of the final resistance value.

19 Claims, 7 Drawing Sheets

HIGH CURRENT SENSE RESISTOR AND PROCESS FOR ITS MANUFACTURE

RELATED APPLICATIONS

This application relates to and claims the filing date of Provisional Application Ser. No. 60/162,054, filed Oct. 28, 1999.

FIELD OF THE INVENTION

This invention relates to a novel electrical resistor structure and process for its manufacture and more specifically relates to a high accuracy, low resistance resistor made with semiconductor device processing techniques.

BACKGROUND OF THE INVENTION

High current demand equipment such as welders, motors and the like are commonly provided with control circuits which are packaged in compact modules. Such modules commonly use surface mounted semiconductor components. It is necessary for the control function to measure the current drawn by the apparatus being controlled. A very low value current sensing resistor, for example, 1.0 milliohms could be used for this application with such apparatus drawing 10's of amperes which flow through the current sensing resistor. Conventionally such resistors are comprised of an accurately configured layer of a low resistance material such as well know manganin or aluchrom alloys having a low temperature coefficient of resistance to insure accuracy over a given working temperature range. These devices are commonly separately housed externally of the module and use separate resistor-making technology.

It would be desirable to produce a precise low resistance value, high wattage resistor which can be made in accordance with compatible semiconductor device type technology and could be mounted with power semiconductor die within a module.

BRIEF SUMMARY OF THE INVENTION

A low resistance high current sense resistor, for example, about 1 milliohm and about 10 watt, and having an accuracy of from 1 to 10%, and capable of surface mounting in a high power control module is provided. The device is made using standard semiconductor processing techniques and materials, and can employ fuse links to enable the accurate trimming of the resistor value. More specifically, a standard silicon wafer of the kind used for the manufacture of semiconductor devices such as diodes, MOSFETs, IGBTs, and thyristors and the like is processed, using traditional wafer fabrication techniques, and is diced at the end of the processing to define individual resistor die.

During the processing, the top surface of the wafer is first oxidized to produce a thin silicon dioxide layer. Thereafter, a "resistive" layer of any desired material, for example aluminum, titanium or a thermally stable alloy such as manganin is deposited atop the oxide layer. The resistive layer is then photolithographically processed to etch a pattern in the resistive layer to define laterally spaced and distributed resistor regions and electrode regions to define a lateral current path through the resistive layer, having the desired resistance values. The bottom surface of the semiconductor wafer is then metallized with a standard conductive electrode, for example, a traditional chromium, nickel, silver trimetal. In a first embodiment of the invention, the wafer is then diced to define a plurality of identical die suitable for surface mounting on a module heat sink such as a patterned conductive plate, for example an IMS board, along with power semiconductor die.

Conventionally, a low value, high accuracy current sense resistor will have copper terminals which are several hundred microns thick to ensure independence of the final resistor value from the precise location of lead wires on the terminal area. However, copper layers that thick are not compatible with standard semiconductor manufacture. In accordance with a second embodiment of the invention a novel multi-terminal arrangement is provided, employing multiple thin aluminum layers.

Further, in the second embodiment of the invention, and in order to more accurately trim the resistance value of the resistor, the resistive layer may receive a second silicon dioxide layer on the top thereof and a second resistive layer of the same or a different material than the first layer. The second resistive layer is patterned to define a larger number of parallel resistors which make selective, and fusible connections to the underlying resistive layer. The current path along the interconnected first and second resistive layers can then be adjusted by fusing the connection links by applying fusing potentials to selected links.

Other features and advantages of the present invention will become apparent from the following description of the invention which refers to the accompanying drawings.

DETAILED DESCRIPTION OF THE DRAWINGS

Control circuits for high current devices such as welding equipment, motor drives and the like would benefit from the use of surface mount current sense resistors inside of a power module. Conventionally, such resistors use precision resistance alloys (manganin or aluchrom) in which the low temperature coefficient of resistance ensures accuracy in the working temperature range. However, in switch-mode power applications, microprocessor systems are used in the control circuits. Thus, it is very desirable to use a resistor with a large temperature coefficient of resistance to sense either or both current and temperature inside a power module.

Figure 1A:
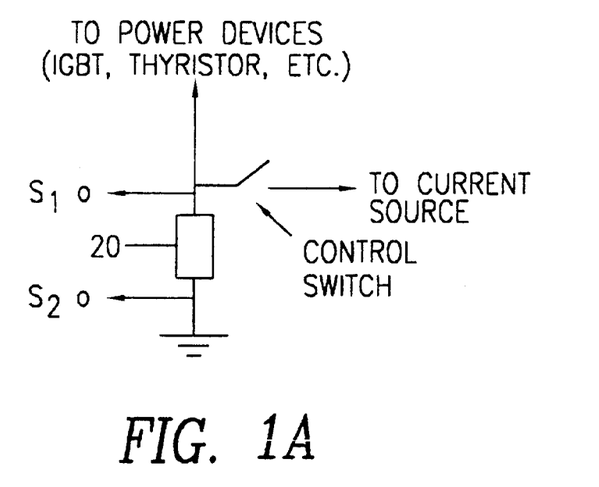
FIG. 1A is a circuit diagram of a novel application for the resistor of the present invention.
Figure 1B:
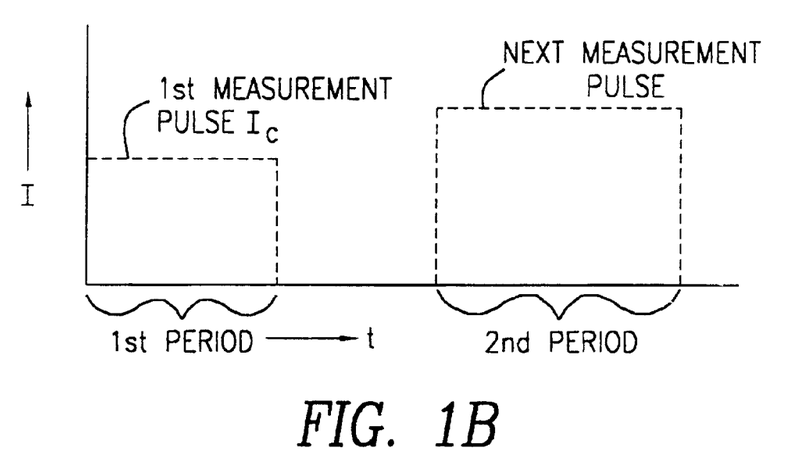
FIG. 1B shows a time-current schedule for the operation of the circuit of FIG. 1A.

This function can be carried out with one additional switch and a calibrated current source as shown in FIG. 1A. The device operates as follows: At the beginning of the first period (FIG. 1B), when the power device of FIG. 1A is switched off, a control switch is connected to apply a current pulse Ic from a calibrated current source through the sense resistor 20. By measuring voltage drop Vm1 across resistor R1, the resistance R1 can be calculated from formula.

$$R1 = Vm1/Ic \quad (1)$$

Figure 2:
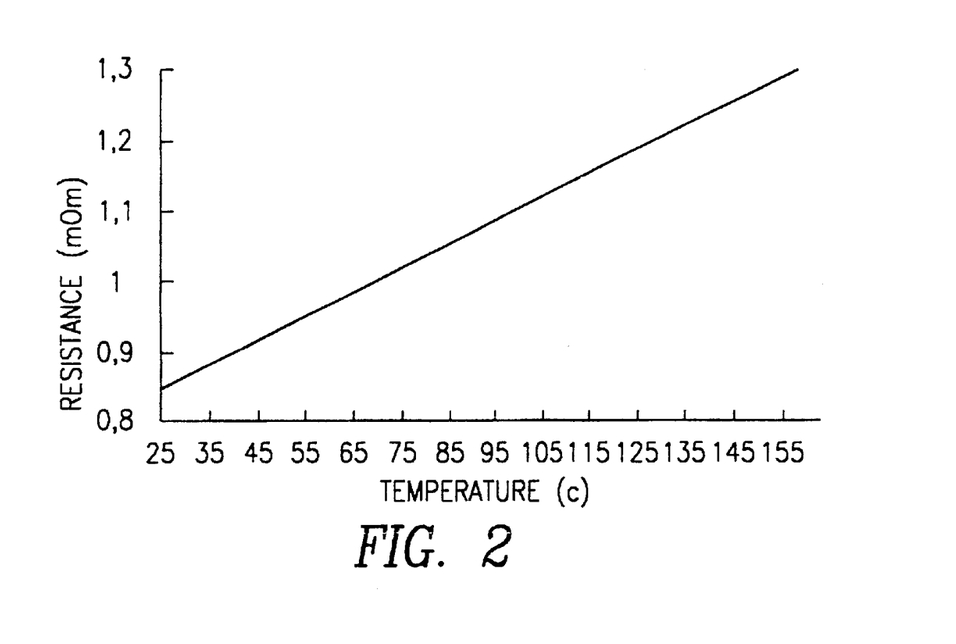
FIG. 2 shows the variation of resistance as a function of temperature for the resistor of FIGS. 1A and 1B.

The device temperature can be obtained from the resistance-temperature curve of FIG. 2. Thus, when the power device is switched on, the resistor can sense the current during the second period (FIG. 1B). Then the current value is:

$$I = Vm2/R2 \quad (2)$$

where Vm2 is the voltage drop across resistor 20 sensed in the second period and R2 is resistance value at this moment.

It can be assumed that the temperature of resistor 20 between first and second sensing periods does not change, so that the values of resistances $R_1$ and $R_2$ are equal. Therefore, the current value I is:

$$I = Ic(Vm2/Vm1) \quad (3)$$

These measurements are repeated in the next period.

By using this measurement mode, the definition of current value does not depend on the resistance value and a current sense resistor with not very high tolerance (accuracy) can be used. However, the tolerance of the resistor is important for temperature sensing.

The novel resistor to be described is well adapted for the afore-described application, but has a wide application to any low resistance value, high current sense application.

Two high current sense resistor embodiments are described in the following. Each are illustrated as 1 mΩ sense resistors made in a chip version and suitable for aluminum wire bonding with four terminal pads, T1 and T2 for current, and S1 and S2 for the sense. The size of the current terminals permits the bond, for example, of 3×15/20 mil Al wires for applications up to 100 Amperes. It would be understood that these values are illustrative only, and that any resistance value and any desired current rating can be met.

A high current resistive layer and termination is formed with a 20 μm thick aluminum layer 30 (FIGS. 8, 9 and 12) deposited atop a thin oxide layer 31, which is in turn grown atop silicon wafer 32. The backside surface of wafer 32 is metallized with a solderable Cr—Ni—Ag metallization 33 (FIGS. 8 and 12) or any other suitable back metal.

Figure 8:
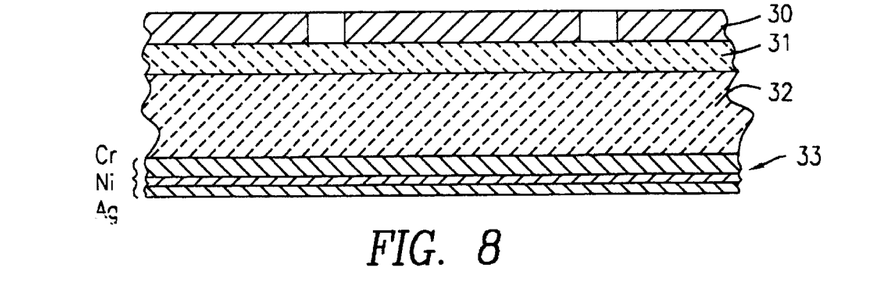
FIG. 8 shows the cross-section of FIG. 7 after the formation of a bottom electrode thereon.
Figure 12:
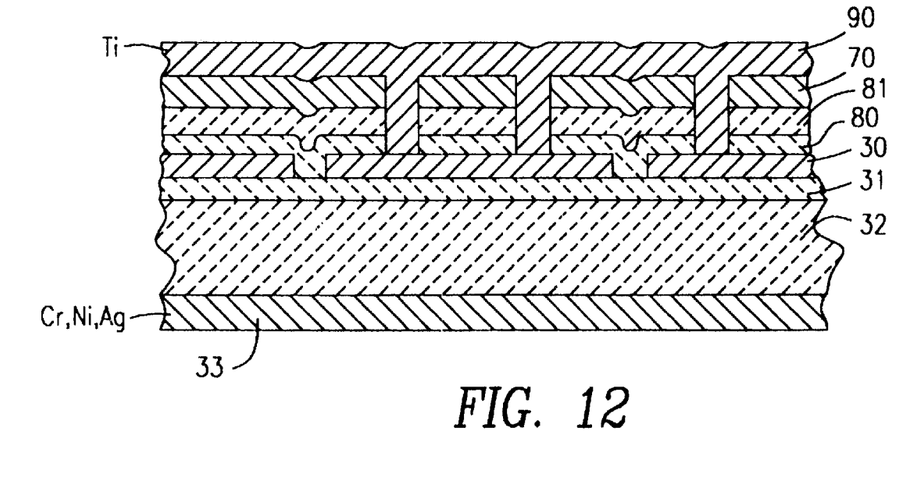
FIG. 12 shows the formation of further fusible resistor elements of the lower resistive layer.

The final resistor element has excellent heat conductivity through the silicon substrate 32 to a mounting board or surface (not shown) to which metal electrode 33 may be soldered or otherwise thermally and/or electrically coupled. The same board or surface can receive power switching dies.

This enables a high power dissipation rating for the resistor such as 10 watts. The use of aluminum 30 in FIGS. 8, 9 and 12 for the resistive layer produces a 4100 ppm/° C. high temperature coefficient of resistance and permits the realization of two functions: current sensing and/or temperature sensing. The first embodiment (FIGS. 8 and 9) is simple with a ±5-% to 10% accuracy of resistance value. The second embodiment is more complex (FIG. 12) but can be adapted to a trimming operation to ensure ±1-% accuracy of resistance value.

Aluminum is chosen as the resistive material for a 1 mΩ current sense resistor because it has a low bulk sheet resistance (0.028 μΩm). A layer 20 μm thick (standard for power semiconductor devices) will produce about 1.5 mΩ/□ sheet resistivity. Other metals or alloys can be used for the resistive layer, as desired.

The fabrication process of these resistors is compatible with thyristor, IGBT and IC chip processing technology. Such a low resistance resistor can also be integrated in the power device chip. Prior art precision resistance alloys such as "manganin" or "aluchrom", (the sheet resistance is 0.3 to 1.5 μΩm) require a very thick layer of metal to obtain the same resistance value (300 μm for manganin and 800 μm for aluchrom) as compared to aluminum. The fabrication process of such prior art resistors is not compatible with that of semiconductor devices.

A major consideration in the novel resistor design for current sense application is to ensure high accuracy of a nominal value of resistance. The relative deviation of the nominal value of resistance is expressed by:

$$\delta R/R = \delta R_s/R_s + \delta L/L - \delta B/B$$

where $R_s$ is sheet resistivity, L is length of the resistive path and B is the width of the resistive path. These deviations are caused by process technology limitations, such as the achievable tolerances of layer thickness and geometry. The resistor accuracy can be 5 to 15%. Therefore, an "adjustment" is necessary to produce precise resistors.

There are known methods of resistor adjustment such as electrochemical etching, laser trimming, cutting holes or isolated channels in resistive layer, current trimming, etc.

Two resistor embodiments are described herein:

1. A low cost design, 1mΩ resistor, without finish trimming with ±5% to ±10% resistance value tolerance (FIGS. 8 and 9); and 2. A current pulse trimming design, 1 mΩ resistor, with ±1% resistance value tolerance (FIG. 12).

Figure 9:
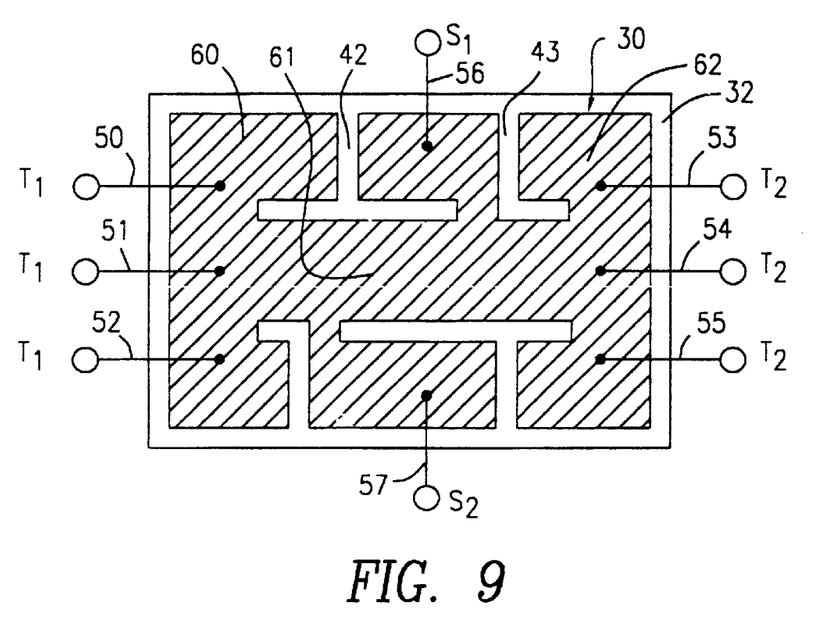
FIG. 9 is a top view of one die separated from the wafer of FIG. 8 for a first embodiment of the resistor of the invention.
Figure 10:
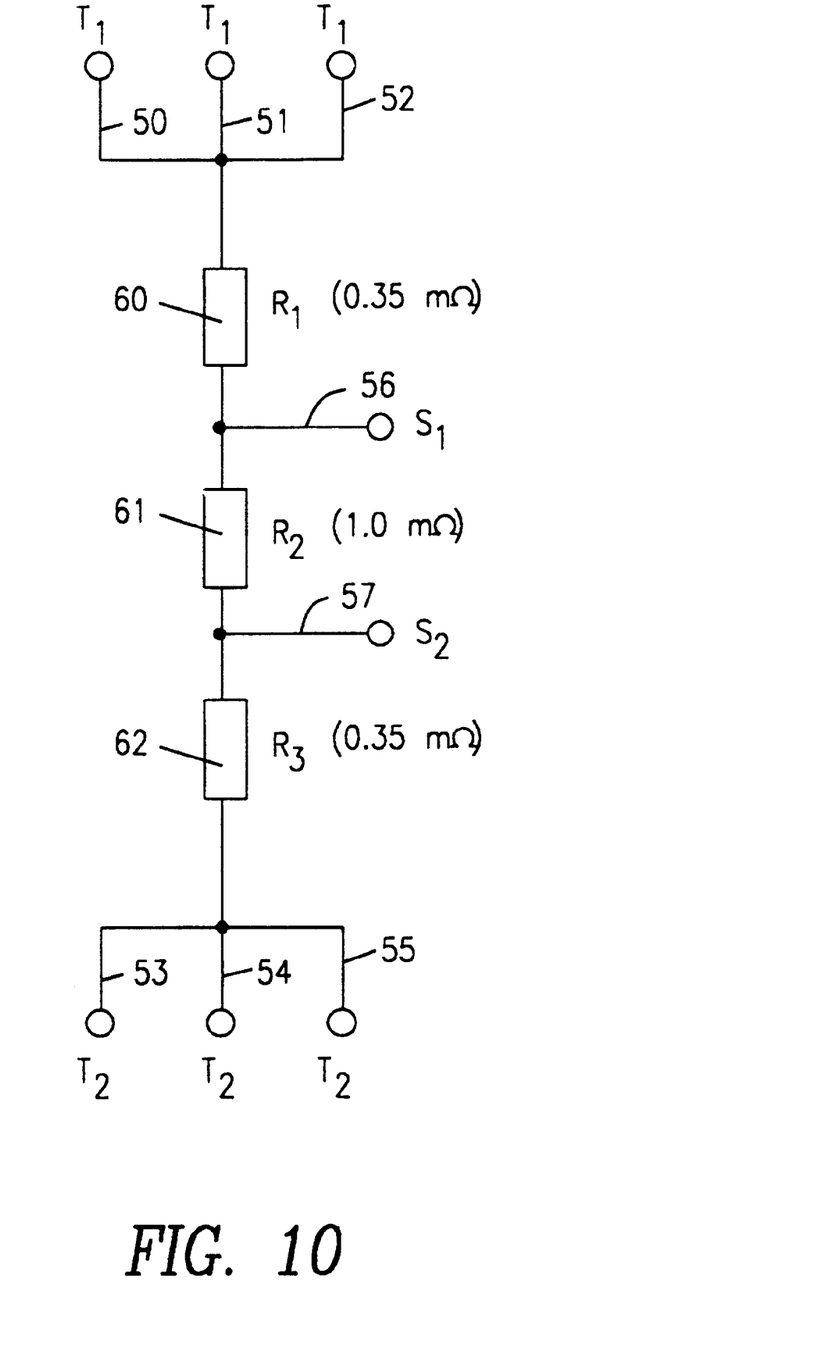
FIG. 10 is an equivalent circuit diagram of the resistor die of FIG. 9.

FIGS. 8, 9 and 10 show a first embodiment of the novel resistor die, and FIGS. 4 to 8 describe the process for its manufacture.

Figure 3:
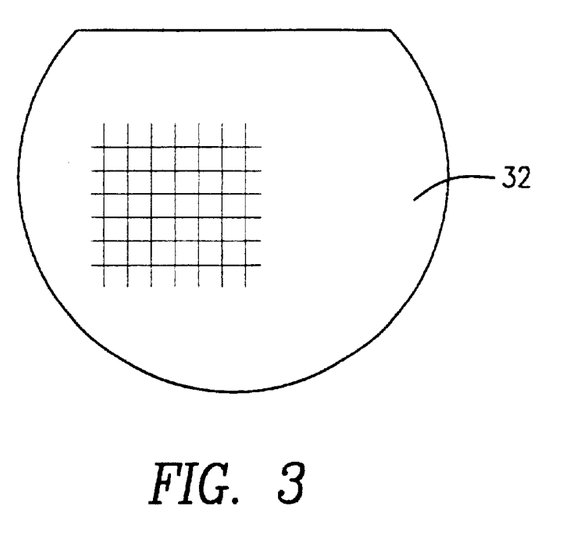
FIG. 3 is a top view of a thin wafer of silicon in which the novel resistors are formed, with a few scribe lines shown within the wafer for separating the die which are simultaneously formed therein.
Figure 4:
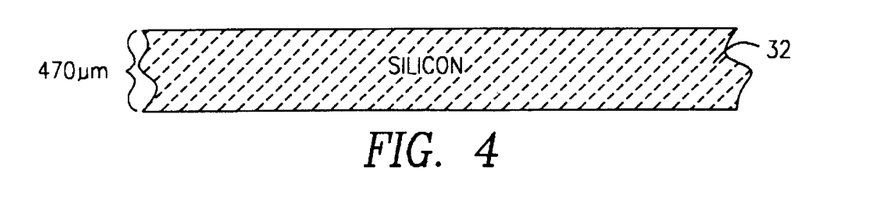
FIG. 4 is a cross-sectional view of a small portion of the wafer of FIG. 3.

Referring first to FIGS. 3 and 4, a plurality of identical die are simultaneously processed in a one mask operation. The die may each be rectangular with a width of about 3.1 mm and a height of about 2.0 mm. These dimensions are not critical.

Thus, the substrate is a silicon wafer (other substrates can be used) which may be 10 cm in diameter and about 300 to 500 μm in thickness. Wafer 32 of FIGS. 3 and 4 has a thickness of about 470 μm and is an N type Cz wafer having a resistivity of 50 to 70 ohm cm (non-critical).

Figure 5:
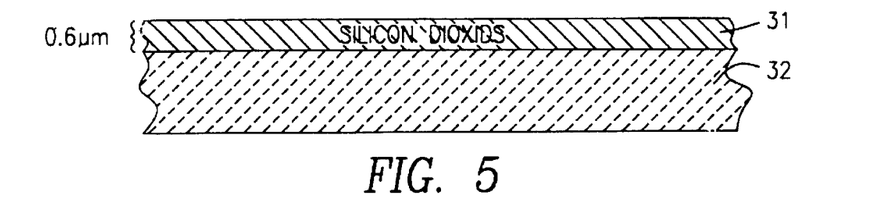
FIG. 5 shows a cross-section of FIG. 4, after the process step of forming a first insulation coating.

The wafer surfaces are first conventionally cleaned, and an insulation layer 31, preferably a silicon dioxide layer, is grown thereon to a non-critical thickness of about 0.6 mm as shown in FIG. 5.

Figure 6:
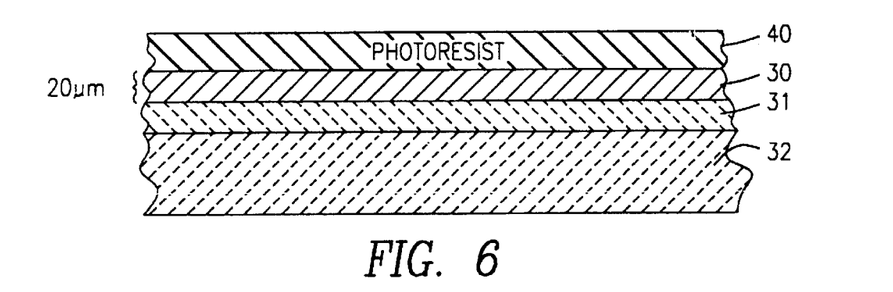
FIG. 6 shows a cross-section of FIG. 5, after the further process steps of forming a resistive coating atop the insulation layer and the application of a photoresist layer atop the resistive layer.
Figure 7:
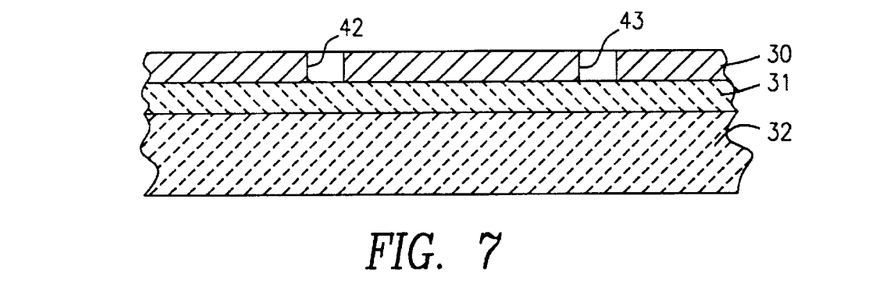
FIG. 7 shows the cross-section of FIG. 8 after the etching of slots in the resistive layer to define distinct lateral conduction regions of various resistivities.

Thereafter, and as shown in FIG. 6, an aluminum layer 30 is deposited atop the oxide layer 31 to a thickness of about 20 μm, using a conventional aluminum e- beam evaporator, or the like. A uniform aluminum layer with minimum contamination is preferred. The bulk sheet resistivity of layer 30 in FIG. 6 is preferably about 0.028 mΩ cm.

Next, a photoresist layer 40 is deposited atop resistive layer 30 and is photolithographically processed in the single mask step of the process to define openings having the pattern shown in FIG. 9. The aluminum exposed is then etched as shown by windows 42 and 43 in FIGS. 7 and 9.

The wafer is then conventionally cleaned and a back side Cr—Ni—Ag trimetal electrode 33 is formed on the back surface as shown in FIG. 8.

During the fabrication process, the usual semiconductor process steps of cleaning and the like are used, and sheet resistance measurements are made during the process for process control. Some adjustment of deviations of resistance from lot-to-lot is possible by etching the aluminum layer to change its thickness until a desired sheet resistance is reached (at the step of FIG. 7). This method can obtain a 2–3% tolerance of the resistance value dispersion between wafers.

Aluminum is an excellent material for resistive layer 30 because of its low resistivity and relatively stable temperature coefficient, and because it is compatible with and widely used in semiconductor manufacturing processes. Furthermore, it is possible to integrate the novel resistor with an IGBT or other MOSgated and thyristor semiconductor die.

FIG. 9 shows the symmetric placement of three wire bonds 50, 51 and 52 to the first common terminal T1 and three wire bonds 53, 54 and 55 to common terminal T2. Wire bonds 56 and 57 are made for sense terminals S1 and S2 respectively. These wire bonds can be varied in number and placement. Other terminal connection systems, for example "bump" electrodes could also be used.

Since the resistor is short (length is 1 mm, and width is 0.7 mm), the output at sense terminals S1 and S2 can vary about ±10% at the same current value depending on bond placement. Finally, the design of FIG. 9 does not permit trimming.

An equivalent circuit diagram of the resistor of FIGS. 8 and 9 is shown in FIG. 10. Thus, the pattern shown in FIG. 9 defines three series resistive regions 60, 61 and 62, termed R1, R2 and R3. Terminals T1 and T2 are connected to the short wide sections 60 and 62, which each have a resistance of 0.35 mΩ. The central resistor section 61 is longer and narrower than sections 60 and 62 and thus has the higher resistance of 1.0 mΩ. Obviously, the geometry can be changed to vary the number of resistor segments and their resistance values, as desired. Wire bond 56 to terminal S1 is connected to the node of resistors 60 and 61 while the terminal S2 is connected to the node between resistors 61 and 62.

In operation, and if the terminals T1 and T2 are in a current carrying circuit which carries, for example 0 to 100 amperes, the voltage drop across resistor 62 (R2) will be 0 to 0.1 volt, thus producing an accurate measure of the current at sense terminals S1 and S2.

Figure 11:
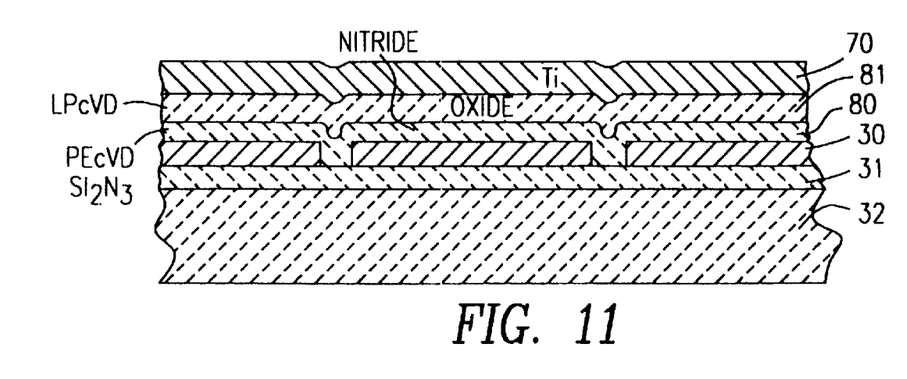
FIG. 11 shows the process steps, following the step of FIG. 7 for forming a second resistive layer in accordance with a second embodiment of the invention.
Figure 13:
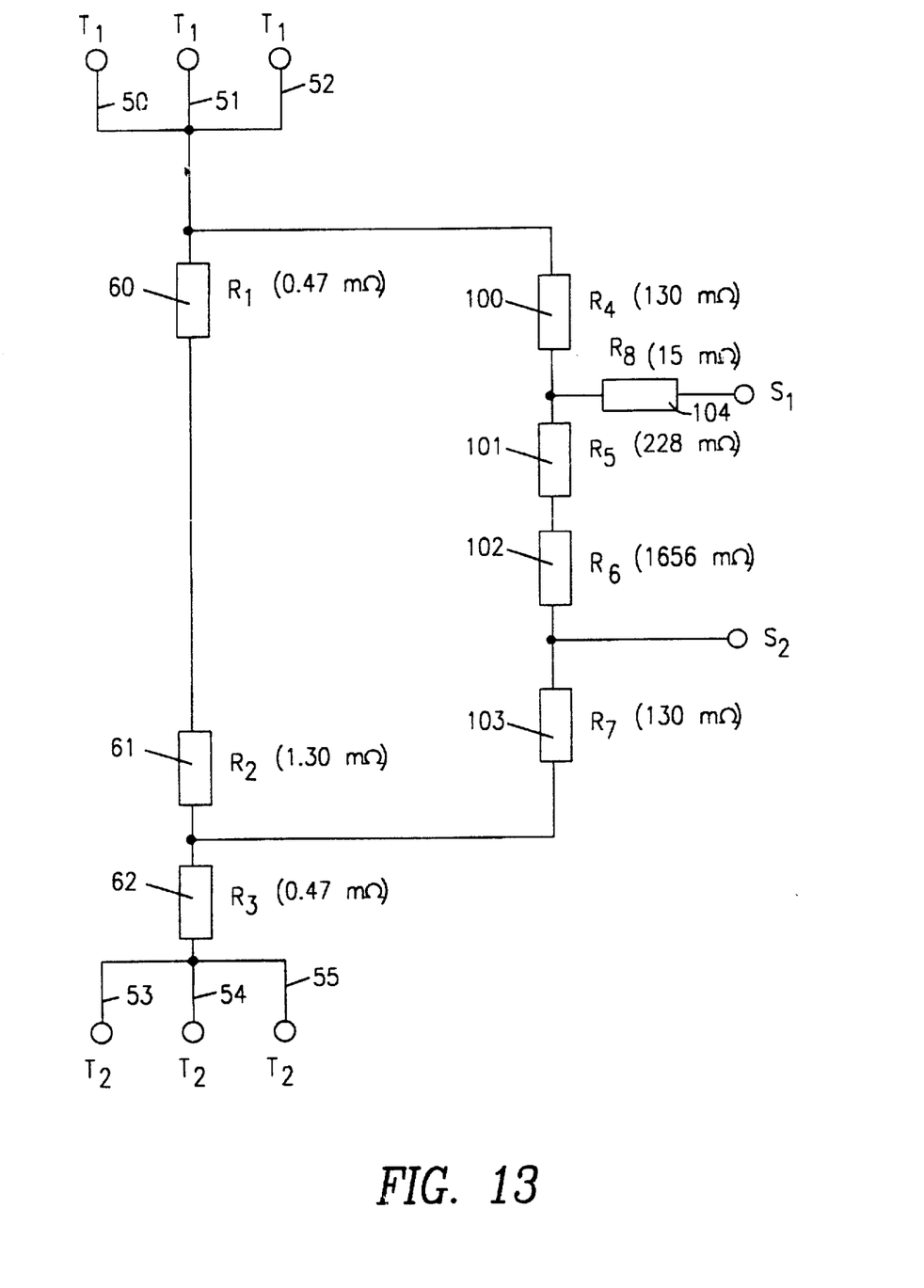
FIG. 13 is an equivalent circuit diagram of the device of FIG. 12.

FIGS. 11, 12 and 13 show a modified structure of the resistor of FIGS. 8, 9 and 10 which permits trimming of the resistor value and less sensitivity to the placement of the wire bonds. More specifically, in the structure of FIG. 12, a second resistive layer 70 is added to the structure.

Thus as shown in FIG. 11, and following the process step of FIG. 8, an LPCVD oxide layer 80 and then a PECVD nitride layer 81 are deposited over the top of patterned resistive layer 30, which is the main current carrying layer to produce a sense voltage. An isolation layer is then formed and is patterned to form windows for current and sense connections. The second resistive later 70 is then evaporated atop nitride 81. Titanium or any other suitable material can be used. A pattern of fusible links are then formed. Photolithographic steps are used to form a pattern of openings or slits of a given geometry in the titanium layer and the underlying insulation layer exposing the surface of aluminum layer 30. Thereafter, aluminum layer 90 (FIG. 12) is deposited atop the wafer and over the titanium later 70, contacting the lower aluminum layer 30 where permitted by the slits in layers 70, 80 and 81.

The aluminum layer 90 is then suitably patterned to define plural structures, such as terminals and resistors for example, resistors 100 to 104 which are connected to the resistors 60, 61 and 62 as shown in FIG. 13. The wafer is then cleaned, annealed and the backside contact 33 is formed thereon.

It should be noted that the titanium and aluminum used for resistive layers 70 and 90 respectively can be interchanged; or any other desired resistive materials can be used.

As shown in FIG. 13, the pattern in layer 30 is adjusted so that resistors 60, 61 and 62 have values of 0.47 mΩ, 1.30 mΩ and 0.47 mΩ respectively. The patterns in layers 70 and 90 define resistors 100 to 104 having the values shown and are connected in parallel with resistors 60 and 61. Sense terminals S1 and S2 are connected to the nodes between resistors 100 and 101, and between resistors 102 and 103 respectively.

The configuration of FIGS. 12 and 13 integrates the voltage drop across the resistor using a plurality of contact points in fixed steps which can be selected by opening fusible links (in titanium layer 70) as desired for current trimming. Thus the resistance value between terminals S1 and S2 is easily adjusted by shortening the resistors as desired to achieve a desired total resistance value.

Any desired number of resistance "taps" can be employed. In the actual embodiment of the invention, sixty-four trimmable resistors can be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A current sense resistor comprising a thin silicon die having an upper and lower surface;

an insulation layer disposed atop said upper surface of said silicon die;

a resistive layer disposed atop said insulation layer;

a plurality of slits in said resistive layer into at least three serially arranged lateral regions having respective lengths and widths to define respective lateral resistance values;

first and second main terminal regions disposed at opposite ends of said serially arrange lateral regions;

first and second sense electrodes connected at opposite respective ends of one of said lateral regions, whereby the current flowing between said first and second main terminals produces a related voltage drop across said one of said lateral regions; and     a plurality of symmetrically spaced wire bonds connected to said first and second main terminals which are aligned perpendicularly to the direction along which said lateral regions extend.

2. The resistor of claim 1, which further includes a conductive electrode layer disposed on said lower surface of said thin silicon die.

3. The resistor of claim 1, wherein said insulation layer is silicon dioxide.

4. The resistor of claim 1, wherein said resistive layer is aluminum.

5. The resistor of claim 4, wherein said aluminum has a constant thickness of about 20 μm.

6. The resistor of claim 2, wherein said resistive layer is aluminum.

7. The resistor of claim 6, wherein said insulation layer is silicon dioxide.

8. The resistor of claim 7, wherein said aluminum has a constant thickness of about 20 μm.

9. The resistor of claim 8, which further includes a plurality of symmetrically spaced wire bonds connected to said first and second main terminals which are aligned perpendicularly to the direction along which said lateral regions extend.

10. The resistor of claim 1, which further includes;
a second insulation layer atop said resistive layer and a second resistive layer atop said second insulation layer;
said second resistive layer having slits therein to define a second plurality of separate but interconnected resistive regions; and
selected nodes of said second plurality regions being connected to selected areas of said first resistive region.

11. The resistor of claim 10, wherein said second resistive layer includes titanium.

12. The resistor of claim 10, wherein said second plurality of interconnected resistive regions include fusible links to enable the selective connection of said regions in parallel to trim the total resistance value between said sense electrodes.

13. A current sense resistor comprising a thin silicon die having an upper and lower surface;
an insulation layer disposed atop said upper surface of said silicon die;
a resistive layer disposed atop said insulation layer;
a plurality of slits in said resistive layer into at least three serially arranged lateral regions having respective lengths and widths to define respective lateral resistance values;
first and second main terminal regions disposed at opposite ends of said serially arrange lateral regions;
a second insulation layer atop said resistive layer and a second resistive layer atop said second insulation layer;
said second resistive layer having slits therein to define a second plurality of separate but interconnected resistive regions;
selected nodes of said second plurality regions being connected to selected areas of said first resistive region; and
first and second sense electrodes connected to selected first and second nodes of said second plurality of interconnected resistive regions.

14. The resistor of claim 13, which further includes a conductive electrode layer disposed on said lower surface of said thin silicon dies.

15. The resistor of claim 13, wherein said resistive layer is aluminum.

16. The resistor of claim 13, wherein said insulation layer is silicon dioxide.

17. The resistor of claim 13, wherein said aluminum has a constant thickness of about 20 μm.

18. The resistor of claim 13, which further includes a plurality of symmetrically spaced wire bonds connected to said first and second main terminals which are aligned perpendicularly to the direction along which said lateral regions extend.

19. The resistor of claim 13, wherein said second plurality of interconnected resistive regions include fusible links to enable the selective inclusion of said regions in parallel connection to trim the total resistance value between said sense electrodes.

* * * * *